(12) United States Patent
Shill

(10) Patent No.: US 10,965,277 B1
(45) Date of Patent: Mar. 30, 2021

(54) INPUT CIRCUITRY FOR INTER-INTEGRATED CIRCUIT SYSTEM

(71) Applicant: TEXAS INSTRUMENTS INCORPORATED, Dallas, TX (US)

(72) Inventor: Mark Allan Shill, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/691,072

(22) Filed: Nov. 21, 2019

(51) Int. Cl.
*H03K 3/037* (2006.01)
*H03K 17/687* (2006.01)

(52) U.S. Cl.
CPC ......... *H03K 3/037* (2013.01); *H03K 17/6871* (2013.01)

(58) Field of Classification Search
CPC ............................ H03K 17/3871; H03K 3/037
See application file for complete search history.

(56) References Cited

U.S. PATENT DOCUMENTS

| | | | |
|---|---|---|---|
| 6,252,437 B1 * | 6/2001 | Fischer | H03K 5/2481 327/563 |
| 8,344,760 B2 * | 1/2013 | Du | G11C 7/1051 327/108 |

* cited by examiner

*Primary Examiner* — Lincoln D Donovan
*Assistant Examiner* — Colleen J O Toole
(74) *Attorney, Agent, or Firm* — John R. Pessetto; Charles A. Brill; Frank D. Cimino

(57) ABSTRACT

Inter-integrated circuit input circuitry includes a pull-up current circuit and an input circuit. The input circuit includes an output inverter, an input inverter, and a pull-up circuit. The pull-up circuit is coupled to an input of the input inverter, and includes a pull-up transistor and a cascode transistor. The pull-up transistor is coupled to the input of the input inverter. The cascode transistor is coupled to the pull-up current circuit and the pull-up transistor, and configured to isolate the pull-up transistor from capacitance of a conductor coupled to the pull-up current circuit and the input circuit.

5 Claims, 4 Drawing Sheets

US 10,965,277 B1

INPUT CIRCUITRY FOR INTER-INTEGRATED CIRCUIT SYSTEM

BACKGROUND

Various serial communication buses have been developed to reduce the cost and complexity associated with communication using parallel buses. The inter-integrated circuit ($I^2C$) bus is one such serial bus. The $I^2C$ bus uses two conductors (assuming a common ground) to provide communication between electronic devices (e.g., communication between a microcontroller and one or more peripheral devices). A first conductor connects a clock output terminal of a master device to a clock input terminal of one or more slave devices. A second conductor connects data input/output terminals of the interconnected devices.

SUMMARY

Inter-integrated circuit ($I^2C$) input circuitry that reduces timing variation caused by parasitic capacitance on pull-up current routing is disclosed herein. In one example, $I^2C$ input circuitry includes a pull-up current circuit, and an input circuit. The input circuit includes a signal input terminal, a signal output terminal, an output transistor, a first transistor, a second transistor, and a cascode transistor. The output transistor includes a first terminal coupled to the signal output terminal, and a second terminal coupled to a power supply rail. The first transistor includes a first terminal coupled to the input terminal, and a second terminal coupled to a first bias voltage source. The second transistor includes a first terminal coupled to a third terminal of the first transistor, and a second terminal coupled to a third terminal of the output transistor. The cascode transistor includes a first terminal coupled to a third terminal of the second transistor, a second terminal coupled to a second bias voltage source, and a third terminal coupled to an output terminal of the pull-up current circuit.

In another example, $I^2C$ input circuitry includes a pull-up current circuit and an input circuit. The input circuit includes an output inverter, an input inverter, and a pull-up circuit. The pull-up circuit is coupled to an input of the input inverter, and includes a pull-up transistor and a cascode transistor. The pull-up transistor is coupled to the input of the input inverter. The cascode transistor is coupled to the pull-up current circuit and the pull-up transistor, and configured to isolate the pull-up transistor from capacitance of a conductor coupled to the pull-up current circuit and the input circuit.

In a further example, an integrated circuit includes a pull-up current circuit, a first input circuit, and a second input circuit. The first input circuit includes a pull-up input terminal coupled to a first output terminal of the pull-up current circuit. The second input circuit includes a pull-up input terminal, a signal input terminal, a signal output terminal, an output transistor, a first transistor, a second transistor, and a cascode transistor. The pull-up input terminal is coupled to a second output terminal of the pull-up current circuit. The output transistor includes a first terminal coupled to the signal output terminal and a second terminal coupled to a power supply rail. The first transistor includes a first terminal coupled to the input terminal and a second terminal coupled to a first bias voltage source. The second transistor includes a first terminal coupled to a third terminal of the first transistor, and a second terminal coupled to a third terminal of the output transistor. The cascode transistor includes a first terminal coupled to a third terminal of the second transistor, a second terminal coupled to a second bias voltage source, and a third terminal coupled to an output terminal of the pull-up current circuit. The first input circuit is disposed at a first distance from the pull-up circuit and the second input circuit is disposed at a second distance from the pull-up circuit.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Inter-integrated circuit ($I^2C$) input circuitry provided on integrated circuits uses a pull-up current circuit to provide pull-up current to multiple input circuits. The conductors connecting each of the input circuits to the pull-up current circuit are long in some integrated circuits, and the long conductors accumulate large parasitic capacitances. The parasitic capacitances affect the propagation delay of the associated input circuit, and in some implementations cause excessive propagation delay in the input circuit.

The $I^2C$ input circuitry disclosed herein isolates the parasitic capacitance of the conductor connecting the pull-up current circuit and the input circuit from the pull-up circuitry of the input circuit. The isolation is provided by adding a cascode transistor to each input circuit. The cascode transistor passes the pull-up current to the pull-up circuitry of the input circuit. The isolation provided by the cascode transistor eliminates timing dependence related to routing parasitic capacitance and improves the timing performance of the input circuit. The cascode transistor is placed at or part of the input circuit, rather than the pull-up current circuit, and is, in some implementations, biased by voltage generated by the pull-up current circuit.

Figure 1:
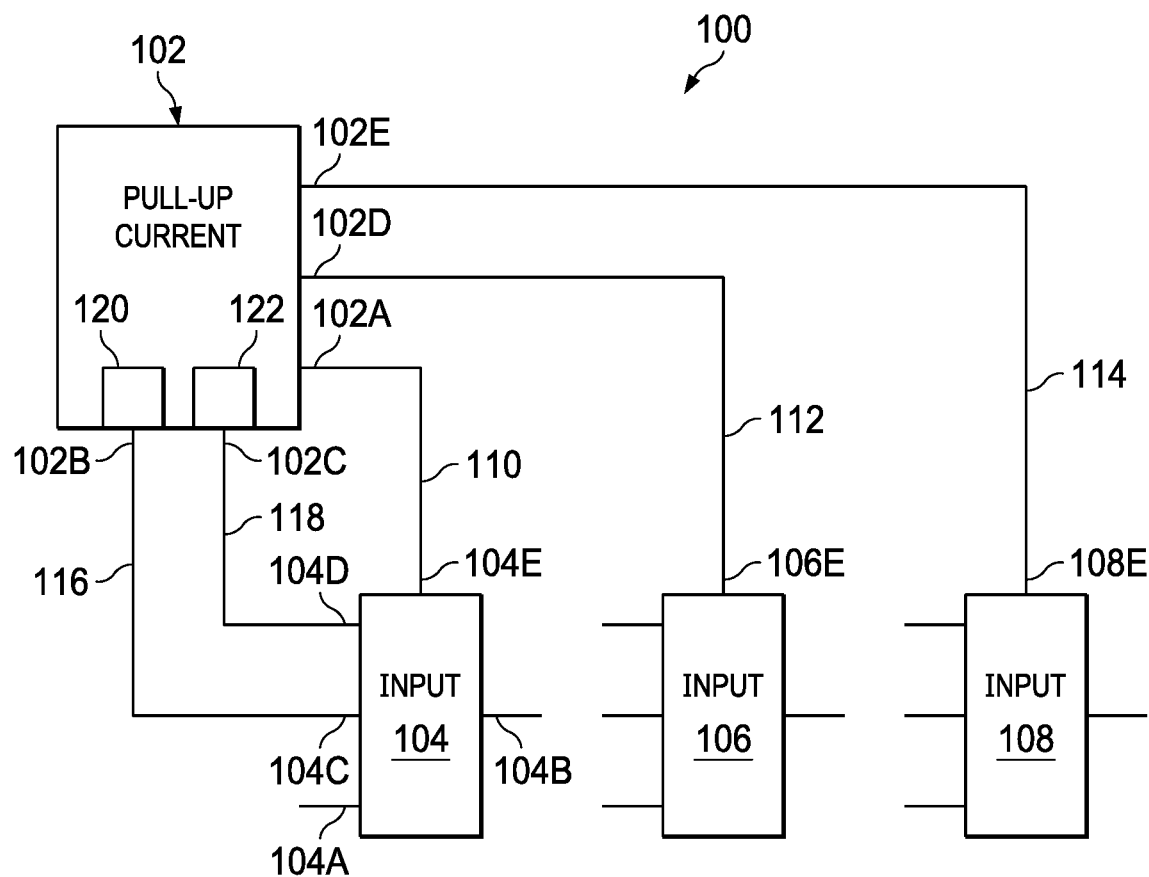
FIG. 1 shows a block diagram for example inter-integrated circuit ($I^2C$) input circuitry in accordance with this description.

FIG. 1 shows a block diagram for a portion of example inter-integrated circuit ($I^2C$) input circuitry 100 in accordance with this description. The $I^2C$ input circuitry 100 includes a pull-up current circuit 102, an input circuit 104, an input circuit 106, and an input circuit 108. The input circuit 106 and the input circuit 108 are similar or identical to the input circuit 104. While the I²C input circuitry 100 is illustrated as including the input circuit 104, the input circuit 106, and the input circuit 108, implementations of the I²C input circuitry 100 include one or more input circuit. The pull-up current circuit 102 provides pull-up current to each of the input circuit 104, the input circuit 106, and the input circuit 108. The pull-up current circuit 102 includes an output terminal 102A coupled to a pull-up input terminal 104E of the input circuit 104 via a conductor 110. Similarly, the pull-up current circuit 102 includes an output terminal 102D coupled to a pull-up input terminal 106E of the input circuit 106 via a conductor 112, and includes an output terminal 102E coupled to a pull-up input terminal 108E of the input circuit 108 via a conductor 114. Each of the input circuit 104, the input circuit 106, and the input circuit 108 includes a cascode transistor that isolates pull-up circuitry from the parasitic capacitance of the conductor 110, the conductor 112, and the conductor 114.

The pull-up current circuit 102 also generates bias voltages for operation of the input circuit 104, the input circuit 106, and the input circuit 108. The pull-up current circuit 102 includes a bias voltage source 120 coupled to an output terminal 102B, which is in turn coupled to an input terminal 104C of the input circuit 104 for providing a bias voltage 116 to the input circuit 104. The pull-up current circuit 102 also includes a bias voltage source 122 coupled to an output terminal 102C, which is in turn coupled to an input terminal 104D of the input circuit 104 for providing a bias voltage 118 to the input circuit 104. The bias voltage 116 and the bias voltage 118 are also provided to the input circuit 106 and input circuit 108.

The input circuit 104 includes a signal input terminal 104A for receiving an input signal (e.g., a clock signal or a data signal), and a signal output terminal 104B for providing a received signal to external circuitry.

Figure 2:
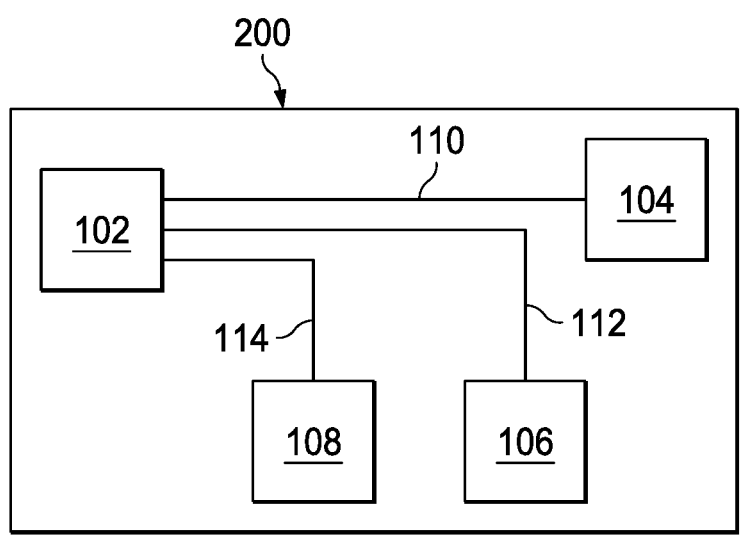
FIG. 2 shows example placement of $I^2C$ input circuitry on an integrated circuit in accordance with this description.

FIG. 2 shows example placement of I²C input circuitry on an integrated circuit 200 in accordance with this description. The integrated circuit 200 includes the pull-up current circuit 102, the input circuit 104, the input circuit 106, and the input circuit 108. The input circuit 104, the input circuit 106, and the input circuit 108 are separated from the pull-up current circuit 102 by some distance and coupled via the conductors 110, 112, and 114 respectively. For example, the pull-up current circuit 102 is disposed on one side of the integrated circuit integrated circuit 200, and the input circuit 104 is disposed on an opposite side of the integrated circuit 200 and connected to the pull-up current circuit 102 via the conductor 110 that traverses the integrated circuit 200. In some implementations of the integrated circuit 200, the input circuit 104 is disposed at a first distance from the pull-up current circuit 102 and the input circuit 106 is disposed at a second distance from the pull-up current circuit 102.

Figure 3:
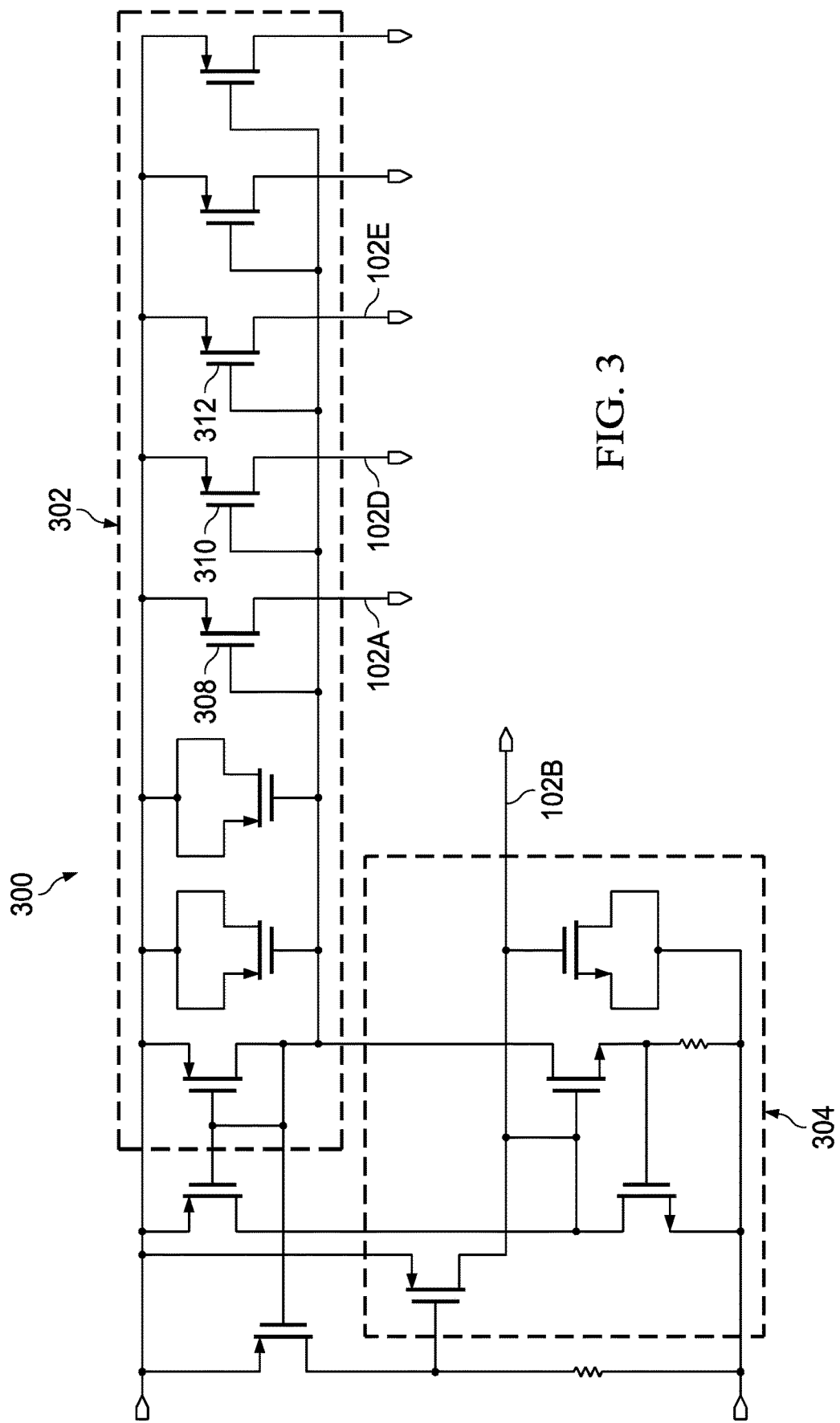
FIG. 3 shows an example $I^2C$ pull-up current circuit in accordance with this description.

FIG. 3 shows an example I²C pull-up current circuit 300 in accordance with this description. The I²C pull-up current circuit 300 is an implementation of the pull-up current circuit 102. The I²C pull-up current circuit 300 includes pull-up current circuitry 302 and bias voltage circuitry 304. The pull-up current circuitry 302 includes a current mirror circuit formed of the diode-connected transistor 306 and output transistors 308, 310, and 312. Each of the output transistors 308, 310, and 312 provides a pull-up current for use by one of the input circuits 104, 106, or 108. For example, the transistor 308 is coupled to the output terminal 102A, the transistor 310 is coupled to the output terminal 102D, and the transistor 312 is coupled to the output terminal 102E.

The bias voltage circuitry 304 is an implementation of the bias voltage source 120, and generates the bias voltage 116 for biasing circuitry of the input circuits 104, 106, and 108. In some implementations of the I²C pull-up current circuit 300, the bias voltage circuitry 304 also encompasses the bias voltage source 122 and generates the bias voltage 118, or the I²C pull-up current circuit 300 includes a circuit similar to the bias voltage circuitry 304 to implement the bias voltage source 122 and generate the bias voltage 118.

Figure 4:
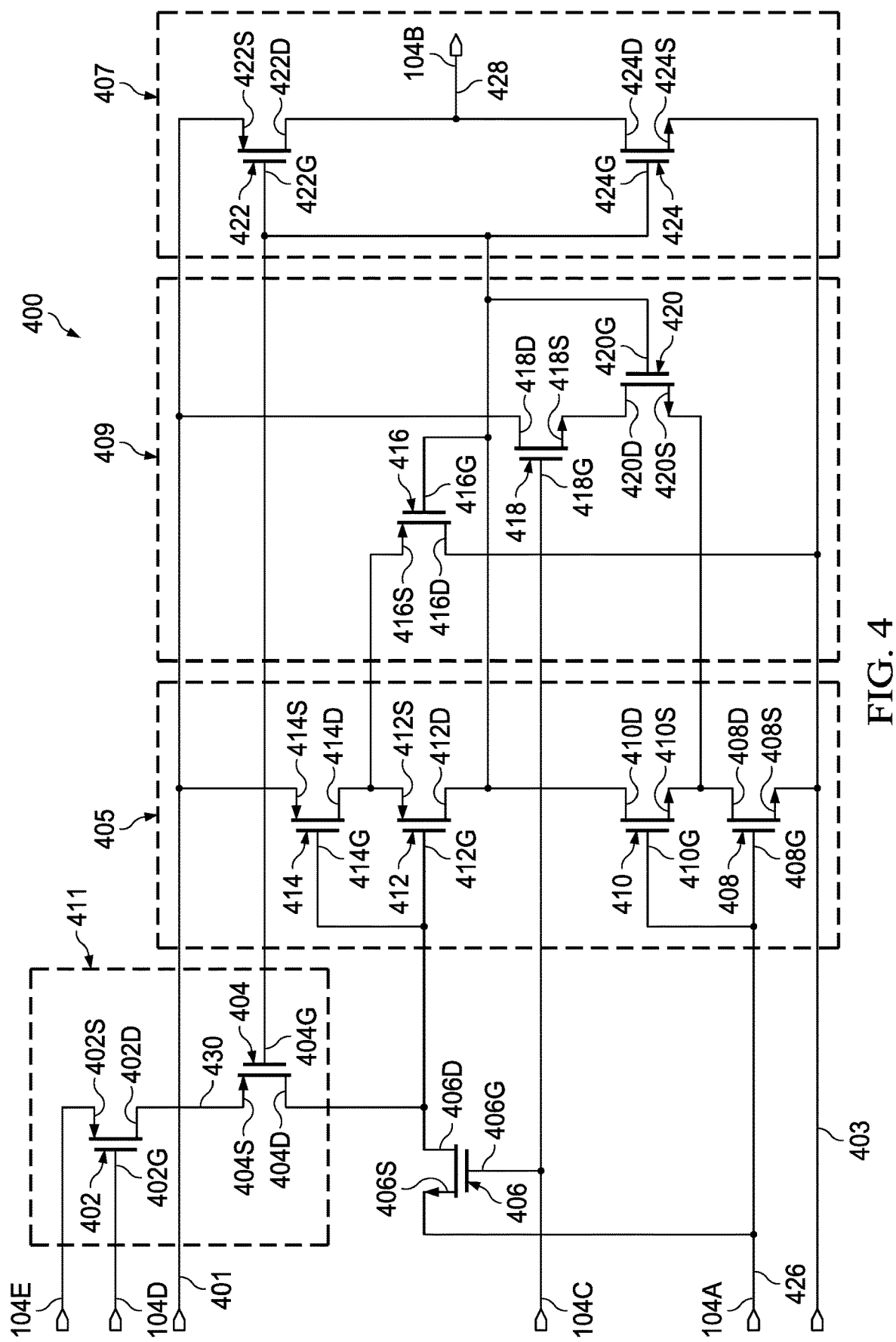
FIG. 4 shows an example $I^2C$ input circuit in accordance with this description.

FIG. 4 shows an example I²C input circuit 400 in accordance with this description. The I²C input circuit 400 is an implementation of the input circuit 104, the input circuit 106, or the input circuit 108. The I²C input circuit 400 includes an input inverter 405, an output inverter 407, feedback circuitry 409, a transistor 406, and a pull-up circuit 411. The input inverter 405 includes a high-side circuit that includes a transistor 412 and a transistor 414, and includes a low-side circuit that includes the transistor 408 and the transistor 410. The transistors 412 and 414 are P-channel metal oxide semiconductor field-effect transistors (MOSFETs) and the transistors 408 and 410 are N-channel MOSFETs in some implementations of the I²C input circuit 400.

The gate terminal 408G of the transistor 408 and the gate terminal 410G of the transistor 410 are coupled to the signal input terminal 104A for reception of an input signal 426. The source terminal 408S of the transistor 408 is coupled to the ground rail 403. The drain terminal 408D of the transistor 408 is coupled to the source terminal 410S of the transistor 410.

The gate terminal 412G of the transistor 412 and the gate terminal 414G of the transistor 414 are coupled to the signal input terminal 104A via the transistor 406 for reception of an input signal. The drain terminal 412D of the transistor 412 is coupled to the drain terminal 410G of the transistor 410. The drain terminal 414D of the transistor 414 is coupled to the source terminal 412S of the transistor 412. The source terminal 414S of the transistor 414 is coupled to the power supply rail 401.

The transistor 406 passes the input signal to the transistors 412 and 414. The transistor 406 includes a gate terminal 406G coupled to the input terminal 104C for biasing, a source terminal 406S coupled to the signal input terminal 104A for reception of input signal, and a drain terminal 406D coupled to the gate terminal 412G of the transistor 412 and the gate terminal 414G of the transistor 414. The transistor 406 is an N-channel MOSFET in some implementations of the I²C input circuit 400.

The pull-up circuit 411 includes a pull-up transistor 404, and a cascode transistor 402. The pull-up transistor 404 provides pull-up current at the drain terminal 406D of the transistor 406. The pull-up transistor 404 includes a gate terminal 404G coupled to the drain terminal 410D of the transistor 410 and the drain terminal 412D of the transistor 412, a drain terminal 404D coupled to the drain terminal 406D of the transistor 406, and a source terminal 404S coupled to the pull-up input terminal 104E via the cascode transistor 402. The pull-up transistor 404 operates as a switch that is turned on or off by the signal provided at the drain terminal 410D of the transistor 410. The pull-up transistor 404 and the cascode transistor 402 are P-channel MOSFETs in some implementations of the I²C input circuit 400.

The cascode transistor 402 isolates the pull-up transistor 404 from the parasitic capacitance of the conductor 110. The gate terminal 402G of the cascode transistor 402 is coupled to the input terminal 104D for biasing. The source terminal 402S of the cascode transistor 402 is coupled to the pull-up input terminal 104E for receipt of pull-up current. The drain terminal 402D of the cascode transistor 402 is coupled to the source terminal 404S of the pull-up transistor 404 via a conductor 430. The conductor 110 is longer than the conductor 430. The voltage at the source terminal 402S of the cascode transistor 402 is isolated from the voltage at the drain terminal 402D. As a result, when the input signal pulls down the voltage at the drain terminal 402D, the voltage at the source terminal 402S is not pulled down.

The output inverter 407 includes a high-side transistor 422 and a low-side transistor 424. The gate terminal 422G of the high-side transistor 422 and the gate terminal 424G of the low-side transistor 424 are coupled to the drain terminal 410D of the transistor 410, the drain terminal 412D of the transistor 412, and the gate terminal 404G of the pull-up transistor 404. The source terminal 422S of the high-side transistor 422 is coupled to the power supply rail 401. The drain terminal 422D of the high-side transistor 422 is coupled to the signal output terminal 104B and the drain terminal 424D of the transistor 424. The source terminal 424S of the low-side transistor 424 is coupled to the ground rail 403. The high-side transistor 422 is a P-channel MOSFET and the low-side transistor 424 is an N-channel MOSFET in some implementations of the I²C input circuit 400.

The feedback circuitry 409 provides feedback to the input inverter 405 based on the signal at the input (e.g., gate terminal 422G of the transistor 422) of the output inverter 407, and includes a transistor 416, a transistor 418, and a transistor 420. The feedback provided by the feedback circuitry 409 causes the input inverter 405 to operate as a Schmitt trigger. The transistor 416 includes a gate terminal 416G coupled to the gate terminal 422G of the high-side transistor 422 to provide feedback based on signal at the input of the output inverter 407 to the transistor 412 and the transistor 414. The source terminal 416S of the transistor 416 is coupled to the drain terminal 414D of the transistor 414 and the source terminal 412S of the transistor 412. The drain terminal 416D of the transistor 416 is coupled to the ground rail 403. The transistor 416 is a P-channel MOSFET in some implementations of the I²C input circuit 400.

The transistor 420 includes a gate terminal 420G coupled to the gate terminal 422G of the high-side transistor 422 to provide feedback based on signal at the input of the output inverter 407 to the transistor 408 and the transistor 410. The source terminal 420S of the transistor 420 is coupled to the drain terminal 408D of the transistor 408 and the source terminal 410S of the transistor 410. The drain terminal 420D of the transistor 420 is coupled to the power supply rail 401 via the transistor 418. The gate terminal 418G of the transistor 418 is coupled to the input terminal 104C for biasing. The source terminal 418S of the transistor 418 is coupled to the drain terminal 420D of the transistor 420, and the drain terminal 418D of the transistor 418 is coupled to the power supply rail 401. The transistors 418 and 420 are N-channel MOSFETs in some implementations of the I²C input circuit 400.

Figure 5:
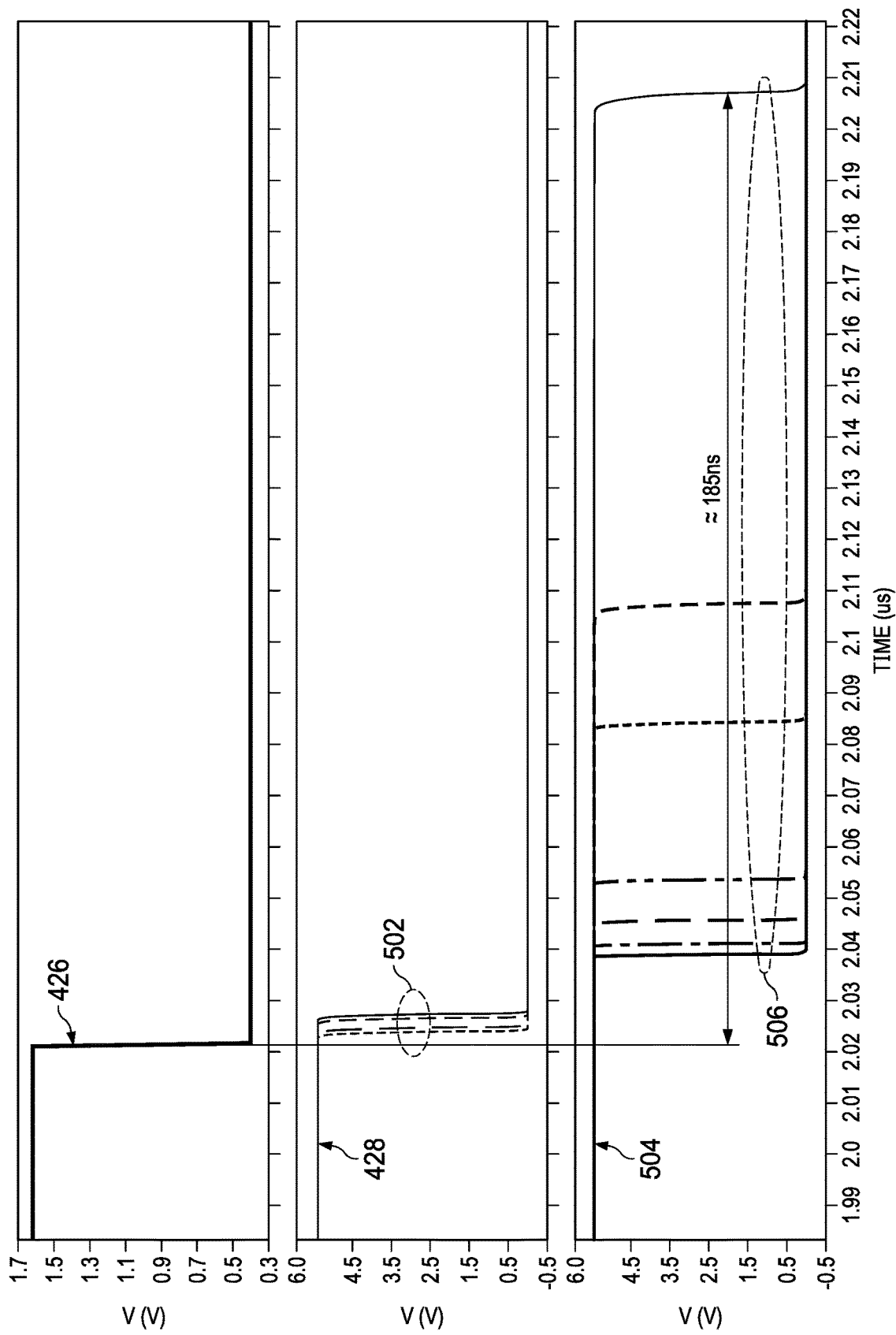
FIG. 5 shows example signals received using $I^2C$ input circuitry in accordance with this description.

FIG. 5 shows example signals received using an implementation of the I²C input circuit 400 in accordance with this description. The input signal 426 is received by the by the I²C input circuit 400, and the output signal 428 shows the range of propagation delays (502) produced by the I²C input circuit 400. For example, the I²C input circuit 400 produces a maximum propagation delay of less than 10 nanoseconds. The signal 504 is produced by an I²C input circuit lacking the cascode transistor 402, and produces propagation delays (506) in range of about 185 nanoseconds.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. Inter-integrated circuit input circuitry, comprising:
   a pull-up current circuit; and
   an input circuit, comprising:
      a signal input terminal;
      a signal output terminal;
      an output transistor comprising:
         a first terminal coupled to the signal output terminal; and
         a second terminal coupled to a power supply rail;
      a first transistor comprising:
         a first terminal coupled to the input terminal; and
         a second terminal coupled to a first bias voltage source;
      a second transistor comprising:
         a first terminal coupled to a third terminal of the first transistor; and
         a second terminal coupled to a third terminal of the output transistor; and
      a cascode transistor comprising:
         a first terminal coupled to a third terminal of the second transistor;
         a second terminal coupled to a second bias voltage source; and
         a third terminal coupled to an output terminal of the pull-up current circuit;
      a third transistor comprising:
         a first terminal coupled to the power supply rail;
         a second terminal coupled to the third terminal of the first transistor;
      a fourth transistor comprising:
         a first terminal coupled to a third terminal of the third transistor;
         a second terminal coupled to the second terminal of the third transistor;
         a third terminal coupled to the third terminal of the output transistor; and
      a fifth transistor comprising:
         a first terminal coupled to the first terminal of the fourth transistor;
         a second terminal coupled to the third terminal of the fourth transistor; and
         a third terminal coupled to a ground rail.

2. The inter-integrated circuit input circuitry of claim 1, further comprising:
   a first conductor disposed between the output terminal of the pull-up current circuit and the third terminal of the cascode transistor; and
   a second conductor disposed between the second terminal of the second transistor and the first terminal of the cascode transistor;
   wherein the first conductor is longer than the second conductor.

3. Inter-integrated circuit input circuitry, comprising:
   a pull-up current circuit; and
   an input circuit, comprising:
      a signal input terminal;
      a signal output terminal;

an output transistor comprising:
    a first terminal coupled to the signal output terminal; and
    a second terminal coupled to a power supply rail;
a first transistor comprising:
    a first terminal coupled to the input terminal; and
    a second terminal coupled to a first bias voltage source;
a second transistor comprising:
    a first terminal coupled to a third terminal of the first transistor; and
    a second terminal coupled to a third terminal of the output transistor; and
a cascode transistor comprising:
    a first terminal coupled to a third terminal of the second transistor;
    a second terminal coupled to a second bias voltage source; and
a third terminal coupled to an output terminal of the pull-up current circuit;
    a third transistor comprising:
        a first terminal coupled to the third terminal of the output transistor;
        a second terminal coupled to the signal input terminal;
    a fourth transistor comprising:
        a first terminal coupled to a third terminal of the third transistor;
        a second terminal coupled to the second terminal of the third transistor; and
        a third terminal coupled to a ground rail; and
    a fifth transistor comprising:
        a first terminal coupled to the first terminal of the fourth transistor;
        a second terminal coupled to the third terminal of the output transistor;
    a sixth transistor comprising:
        a first terminal coupled a third terminal of the fifth transistor;
        a second terminal coupled to the second terminal of the first transistor; and
        a third terminal coupled to the power supply rail.

4. An integrated circuit, comprising:
a pull-up current circuit;
a first input circuit comprising a pull-up input terminal coupled to a first output terminal of the pull-up current circuit;
a second input circuit comprising:
    a pull-up input terminal coupled to a second output terminal of the pull-up current circuit;
    a signal input terminal;
    a signal output terminal;
    an output transistor comprising:
        a first terminal coupled to the signal output terminal;
        a second terminal coupled to a power supply rail;
    a first transistor comprising:
        a first terminal coupled to the signal input terminal;
        a second terminal coupled to a first bias voltage source;
    a second transistor comprising:
        a first terminal coupled to a third terminal of the first transistor;
        a second terminal coupled to a third terminal of the output transistor;
    a cascode transistor comprising:
        a first terminal coupled to a third terminal of the second transistor;
        a second terminal coupled to a second bias voltage source; and
        a third terminal coupled to the second output terminal of the pull-up current circuit;
    wherein the first input circuit is disposed at a first distance from the pull-up circuit and the second input circuit is disposed at a second distance from the pull-up circuit;
    wherein the second input circuit further comprises:
        a third transistor comprising:
            a first terminal coupled to the power supply rail;
            a second terminal coupled to the second terminal of the first transistor;
        a fourth transistor comprising:
            a first terminal coupled to a third terminal of the third transistor; and
            a second terminal coupled to the third terminal of the output transistor; and
        a fifth transistor comprising:
            a first terminal coupled to the third terminal of the fourth transistor and
            a second terminal coupled to a ground rail;
        a sixth transistor comprising:
            a first terminal coupled to the third terminal of the output transistor;
            a second terminal coupled to the signal input terminal; and
            a third terminal coupled to a third terminal of the fourth transistor;
        a seventh transistor comprising:
            a first terminal coupled to a third terminal of the sixth transistor;
            a second terminal coupled to the second terminal of the sixth transistor; and
            a third terminal coupled to a ground rail.

5. The integrated circuit of claim 4, wherein the second input circuit comprises:
an eighth transistor comprising:
    a first terminal coupled to the third terminal of the first transistor;
    a second terminal coupled to the third terminal of the output transistor; and
    a third terminal coupled to a third terminal of the fifth transistor;
a ninth transistor comprising:
    a first terminal coupled to the third terminal of the eighth transistor;
    a second terminal coupled to the third terminal of the first transistor; and
    a third terminal coupled to the power supply rail.

* * * * *